(12) United States Patent
Joanna Chye et al.

(10) Patent No.: US 11,600,547 B2
(45) Date of Patent: Mar. 7, 2023

(54) SEMICONDUCTOR PACKAGE WITH EXPANDED HEAT SPREADER

(71) Applicant: Infineon Technologies Austria AG, Villach (AT)

(72) Inventors: Jo Ean Joanna Chye, Penang (MY); Teck Sim Lee, Melaka (MY); Ke Yan Tean, Melaka (MY); Wei-Shan Wang, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 340 days.

(21) Appl. No.: 16/700,361

(22) Filed: Dec. 2, 2019

(65) Prior Publication Data

US 2021/0166988 A1 Jun. 3, 2021

(51) Int. Cl.
*H01L 23/367* (2006.01)
*H01L 23/40* (2006.01)
(Continued)

(52) U.S. Cl.
CPC ........ *H01L 23/3675* (2013.01); *H01L 23/367* (2013.01); *H01L 23/4093* (2013.01);
(Continued)

(58) Field of Classification Search
CPC . H01L 23/367; H01L 23/3675; H01L 23/433; H01L 23/4334; H01L 23/4093; H01L 23/49551; H01L 23/49555
See application file for complete search history.

(56) References Cited

U.S. PATENT DOCUMENTS 8,049,312 B2 * 11/2011 Herbsommer .... H01L 23/49562
257/666
8,062,932 B2 * 11/2011 Hebert ............. H01L 23/49562
438/121
(Continued)

FOREIGN PATENT DOCUMENTS

KR 20160001373 U 4/2016

OTHER PUBLICATIONS

Abd Hamid, Syahir, et al., "Selective Plating of Semiconductor Package Leads", U.S. Appl. No. 16/036,354, filed Jul. 16, 2018, 1-30.
(Continued)

*Primary Examiner* — Mark W Tornow
*Assistant Examiner* — Abbigale A Boyle
(74) *Attorney, Agent, or Firm* — Murphy, Bilak & Homiller, PLLC

(57) ABSTRACT

A semiconductor package includes a die pad having a die attach surface, a first laterally separated and vertically offset from the die pad, a semiconductor die mounted on the die attach surface and comprising a first terminal on an upper surface of the semiconductor die, an interconnect clip that is electrically connected to the first terminal and to the first lead, and a heat spreader mounted on top of the interconnect clip. The interconnect clip includes a first planar section that interfaces with the upper surface of the semiconductor die and extends past an outer edge side of the die pad. The heat spreader covers an area of the first planar section that is larger than an area of the semiconductor die. The heat spreader laterally extends past a first outer edge side of the die pad that faces the first lead.

20 Claims, 11 Drawing Sheets

(51) Int. Cl.
*H01L 23/498* (2006.01)
*H01L 23/528* (2006.01)
*H01L 23/42* (2006.01)
*H01L 23/495* (2006.01)

(52) U.S. Cl.
CPC ........ *H01L 23/42* (2013.01); *H01L 23/49551* (2013.01); *H01L 23/49555* (2013.01); *H01L 23/49838* (2013.01); *H01L 23/528* (2013.01)

(56) References Cited

U.S. PATENT DOCUMENTS

| | | | | |
|---|---|---|---|---|
| 9,218,987 | B2* | 12/2015 | Liu | H01L 23/49568 |
| 10,727,163 | B2* | 7/2020 | Fujino | H01L 23/48 |
| 11,088,046 | B2* | 8/2021 | Estacio | H01L 23/49517 |
| 2005/0218498 | A1* | 10/2005 | Hata | H01L 24/33 |
| | | | | 257/690 |
| 2008/0054449 | A1 | 3/2008 | Hirler et al. | |
| 2010/0133670 | A1 | 6/2010 | Liu et al. | |
| 2010/0164078 | A1* | 7/2010 | Madrid | H01L 24/40 |
| | | | | 257/675 |
| 2010/0176508 | A1 | 7/2010 | Herbsommer et al. | |
| 2015/0076674 | A1* | 3/2015 | Miyakawa | H01L 23/49568 |
| | | | | 257/675 |
| 2018/0240770 | A1 | 8/2018 | Choi | |
| 2019/0355643 | A1 | 11/2019 | Hong et al. | |

OTHER PUBLICATIONS

Hong, Chii Shang, "Semiconductor Package with Multi-Level Conductive Clip for Top Side Cooling", U.S. Appl. No. 16/575,006, filed Sep. 18, 2019, 1-52.

* cited by examiner

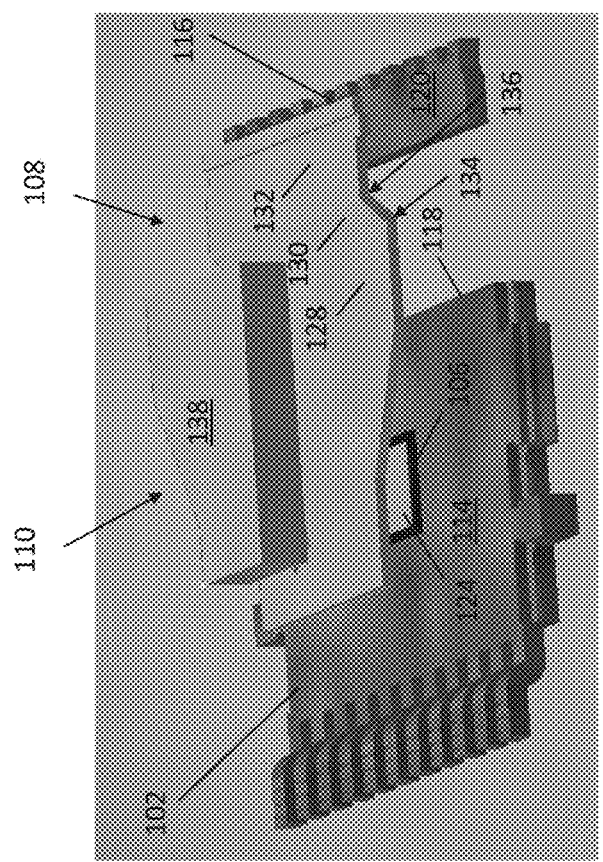
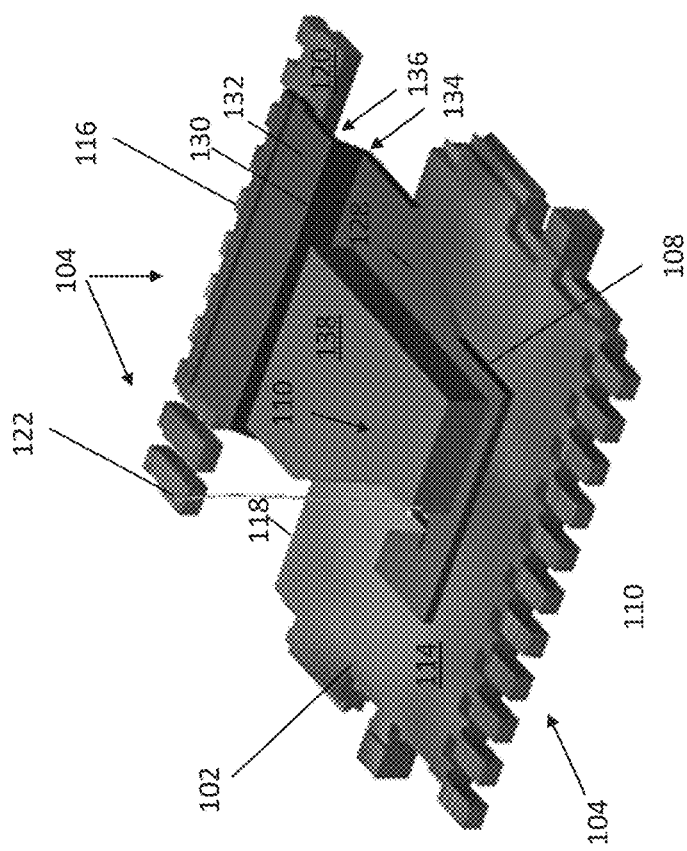
FIGURE 1

SEMICONDUCTOR PACKAGE WITH EXPANDED HEAT SPREADER

TECHNICAL FIELD

Embodiments of this invention generally relate to semiconductor packages and more particularly relate to cooling and interconnect features of semiconductor packages.

BACKGROUND

Semiconductor packages are designed to provide connective compatibility between a semiconductor die and an external apparatus, such as a printed circuit board (PCB). Additionally, semiconductor packages are designed to protect a semiconductor die from potentially damaging environmental conditions, such as temperature variations, moisture, dust particles, etc. An important design consideration in many semiconductor packages is the cooling capability of the package. Many semiconductor dies generate a substantial amount of heat during typical operation. One example of such a device is a power semiconductor device that is rated to block substantially large voltages, e.g., voltages in excess of 200 volts, during normal operation. Cooling features are often provided in semiconductor packages to maintain the semiconductor die at safe temperature ranges during operation.

Dual side cooling packages represent one package design for enhanced thermal dissipation capacity. A dual side cooling package includes a thermally conductive element that draws heat away from a bottom of the die towards a bottom side of the package and a second thermally conductive element that draws heat away from a top of the die towards a top side of the package.

Metal clips are desirable as interconnect features in high power applications due to their large current carrying capability and low thermal resistance. However, the inclusion of a metal interconnect clip in a dual side cooling package creates geometric constraints that limit the placement of cooling features.

SUMMARY

A semiconductor package is disclosed. According to an embodiment, the semiconductor package comprises a die pad comprising a die attach surface, a first lead that is laterally separated from and vertically offset from the die pad, a semiconductor die that is mounted on the die attach surface and comprises a first terminal on an upper surface of the semiconductor die that faces away from the die pad, an interconnect clip that is electrically connected to the first terminal and to the first lead, and a heat spreader mounted on top of the interconnect clip. The interconnect clip comprises a first planar section that interfaces with the upper surface of the semiconductor die and extends past an outer edge side of the die pad. The heat spreader covers an area of the first planar section that is larger than an area of the semiconductor die. The heat spreader laterally extends past a first outer edge side of the die pad that faces the first lead.

Separately or in combination, the interconnect clip comprises a second planar section that forms a first transitional bend with the first planar section and vertically extends towards the first lead, and the first transitional bend is disposed in a lateral gap between the first edge side of the die pad and an interior end of the first lead.

Separately or in combination, the interconnect clip comprises a third planar section that forms a second transitional bend with the second planar section is flush against a connection surface of the first lead, and the first and third planar sections are substantially parallel to one another.

Separately or in combination, the semiconductor die comprises a first outer edge that faces the first lead, a second outer edge opposite the first outer edge, and third and fourth outer edges each extending between the first and second outer edges, and wherein the heat spreader laterally extends past at least two of the first, second, third and fourth outer edges.

Separately or in combination, the semiconductor die further comprises a second terminal on the upper surface of the semiconductor die, the semiconductor package further comprises a second lead that is separated from the die pad by a lateral gap between the first edge side of the die pad and an interior end of the second lead, and an electrically conductive bond wire that electrically connects the second terminal to the second lead, the bond wire extends directly over an exposed region of the upper surface of the semiconductor die, the exposed region being a region of the upper surface of the semiconductor die that includes the second terminal, extends to the third outer edge of the semiconductor die, and is exposed from the interconnect clip.

Separately or in combination, the heat spreader comprises first and second edge faces that form an angled intersection with one another, the second terminal is laterally disposed between the first edge face and the third outer edge of the semiconductor die, and the second edge face laterally extends past the third outer edge of the semiconductor die.

Separately or in combination, the heat spreader comprises a thicker portion and a thinner portion, a lower surface of the thicker portion is flush against the upper surface of the interconnect clip, and a lower surface of the thinner portion laterally extends outward from the thinner portion and is spaced apart from the interconnect clip.

Separately or in combination, the thinner portion comprises a first wing that laterally extends past the first transitional bend.

Separately or in combination, the thinner portion comprises a second wing that laterally extends past the second outer edge of the semiconductor die.

Separately or in combination, the thinner portion comprises a third wing that laterally extends past the third outer edge of the semiconductor die, and wherein the third wing extends over the bond wire.

Separately or in combination, the thinner portion comprises a fourth wing that laterally extends past the fourth outer edge of the semiconductor die.

Separately or in combination, the heat spreader comprises at least one chamfer between two edge faces that are substantially perpendicular to one another.

Separately or in combination, an upper surface of the heat spreader that is opposite from the upper surface of the interconnect clip is corrugated.

Separately or in combination, the heat spreader comprises at least one perforation that extends through opposite facing upper and lower surfaces of the heat spreader.

Separately or in combination, the interconnect clip comprises a thicker portion and a thinner portion, wherein a lower surface of the thicker portion of the interconnect clip is flush against the upper surface of the semiconductor die, and the thinner portion of the interconnect clip laterally extends outward from the thicker portion of the interconnect clip.

Separately or in combination, the heat spreader is a substantially flat structure this is disposed directly on the thicker portion and the thinner portion.

Separately or in combination, an outer perimeter of the heat spreader has a polygon shape.

Separately or in combination, the outer perimeter of the heat spreader comprises an obtuse angle at an intersection between two edge faces, or a u-shaped notch formed by three edge faces.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B, 1C, 1D and 1E, illustrates a semiconductor package with an expanded interconnect clip and heat spreader design, according to an embodiment. FIGS. 1A and 1B each depict an isometric view of the semiconductor package before encapsulation. FIG. 1C depicts a planar view of the semiconductor package before encapsulation with the interconnect clip and without the heat spreader. FIG. 1D depicts a planar view of the semiconductor package before encapsulation with the interconnect clip and the heat spreader. FIG. 1E depicts a cross-sectional view of the semiconductor package after encapsulation with the interconnect clip and the heat spreader.

FIGS. 2A, 2B and 2C, illustrates a semiconductor package with an expanded interconnect clip and heat spreader design, according to an embodiment. FIG. 2A depicts a planar view of the semiconductor package before encapsulation with the interconnect clip and without the heat spreader. FIG. 2B depicts a planar view of the semiconductor package before encapsulation with the interconnect clip and the heat spreader. FIG. 2C depicts a cross-sectional view of the semiconductor package with the interconnect clip and the heat spreader.

FIGS. 3A, 3B and 3C, illustrates a semiconductor package with an expanded interconnect clip and heat spreader design, according to an embodiment. FIG. 3A depicts a planar view of the semiconductor package before encapsulation with the interconnect clip and without the heat spreader. FIG. 3B depicts a planar view of the semiconductor package before encapsulation with the interconnect clip and the heat spreader. FIG. 3C depicts a cross-sectional view of the semiconductor package with the interconnect clip and the heat spreader.

FIGS. 4A, 4B and 4C, illustrates a semiconductor package with an expanded interconnect clip and heat spreader design, according to an embodiment. FIG. 4A depicts a planar view of the semiconductor package before encapsulation with the interconnect clip and without the heat spreader. FIG. 4B depicts a planar view of the semiconductor package before encapsulation with the interconnect clip and the heat spreader. FIG. 4C depicts a cross-sectional view of the semiconductor package with the interconnect clip and the heat spreader.

FIGS. 5A, 5B and 5C, illustrates a semiconductor package with an expanded interconnect clip and heat spreader design, according to an embodiment. FIG. 5A depicts a planar view of the semiconductor package before encapsulation with the interconnect clip and without the heat spreader. FIG. 5B depicts a planar view of the semiconductor package before encapsulation with the interconnect clip and the heat spreader. FIG. 5C depicts a cross-sectional view of the semiconductor package with the interconnect clip and the heat spreader.

FIGS. 6A, 6B, 6C and 6D, illustrates a semiconductor package with an expanded interconnect clip and heat spreader design, according to an embodiment. FIG. 6A depicts a planar view of the semiconductor package before encapsulation with the interconnect clip and without the heat spreader. FIG. 6B depicts a planar view of the semiconductor package before encapsulation with the interconnect clip and the heat spreader. FIG. 6C depicts a cross-sectional view of the semiconductor package with the interconnect clip and the heat spreader in a second lateral direction that is perpendicular to the current flow direction. FIG. 6D depicts a cross-sectional view of the semiconductor package with the interconnect clip and the heat spreader in a first lateral direction that is parallel to the current flow direction.

FIGS. 7A, 7B and 7C, illustrates a semiconductor package with an expanded interconnect clip and heat spreader design, according to an embodiment. FIG. 7A depicts a planar view of the semiconductor package before encapsulation with the interconnect clip and without the heat spreader. FIG. 7B depicts a planar view of the semiconductor package before encapsulation with the interconnect clip and the heat spreader. FIG. 7C depicts a cross-sectional view of the semiconductor package with the interconnect clip and the heat spreader.

FIGS. 8A, 8B and 8C, illustrates a semiconductor package with an expanded interconnect clip and heat spreader design, according to an embodiment. FIG. 8A depicts a planar view of the semiconductor package before encapsulation with the interconnect clip and without the heat spreader. FIG. 8B depicts a planar view of the semiconductor package before encapsulation with the interconnect clip and the heat spreader. FIG. 8C depicts a cross-sectional view of the semiconductor package with the interconnect clip and the heat spreader.

FIGS. 9A, 9B and 9C, illustrates a semiconductor package with an expanded interconnect clip and heat spreader design, according to an embodiment. FIG. 9A depicts a planar view of the semiconductor package before encapsulation with the interconnect clip and without the heat spreader. FIG. 9B depicts a planar view of the semiconductor package before encapsulation with the interconnect clip and the heat spreader. FIG. 9C depicts a cross-sectional view of the semiconductor package with the interconnect clip and the heat spreader.

FIGS. 10A, 10B and 10C, illustrates a semiconductor package with an expanded interconnect clip and heat spreader design, according to an embodiment. FIG. 10A depicts a planar view of the semiconductor package before encapsulation with the interconnect clip and without the heat spreader. FIG. 10B depicts a planar view of the semiconductor package before encapsulation with the interconnect clip and the heat spreader. FIG. 10C depicts a cross-sectional view of the semiconductor package with the interconnect clip and the heat spreader.

DETAILED DESCRIPTION

Embodiments of a dual side cooling package with an advantageous interconnect clip and heat spreader configuration are described herein. The interconnect clip is designed to provide maximal surface area to accommodate the mounting of a large heat spreader thereon, while simultaneously providing electrical connectivity between a semiconductor die and a lead that is vertically offset from the semiconductor die. The interconnect clip includes a large planar section that mates with the semiconductor die and laterally extends past the die pad of the package. This large planar section can accommodate a heat spreader which also laterally extends past the die pad. In an embodiment, this arrangement is made possible by locating a transitional bend of the interconnect clip in a lateral gap between die pad and the first lead. The heat spreader is designed to expand past the semiconductor die and/or the die pad in multiple different directions. In embodiments, this is made possible by a geometric configuration of the heat spreader that is more complex than a simple cubic shape that is typical of conventional heat spreader designs. For example, the heat spreader can include one or more of an L-shaped geometry, a U-shaped geometry, a notch, etc. In another example, the heat spreader has a multi-thickness configuration so that an upper region of the heat spreader can expand past the die and the die pad. In either case, the heat spreader provides a large cooling surface area while simultaneously accommodating a bond wire connection to the semiconductor die. When combined in a single package, the interconnect clip and heat spreader allow for much greater cooling area of the heat spreader (e.g., at least twice as large as the semiconductor die), which beneficially improves thermal dissipation capability.

Figure 1:
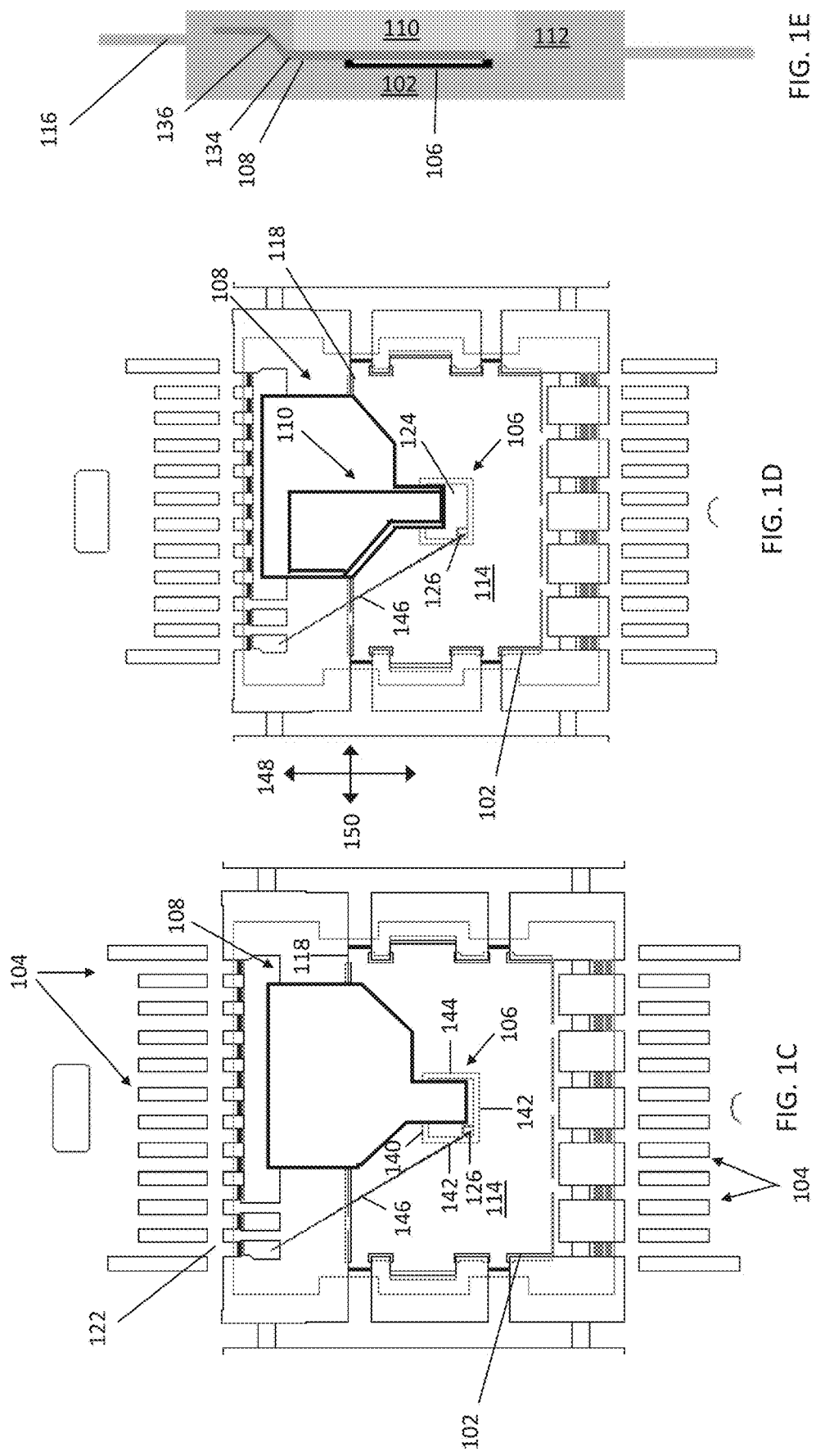
FIG. 1, which includes
Figure 2:
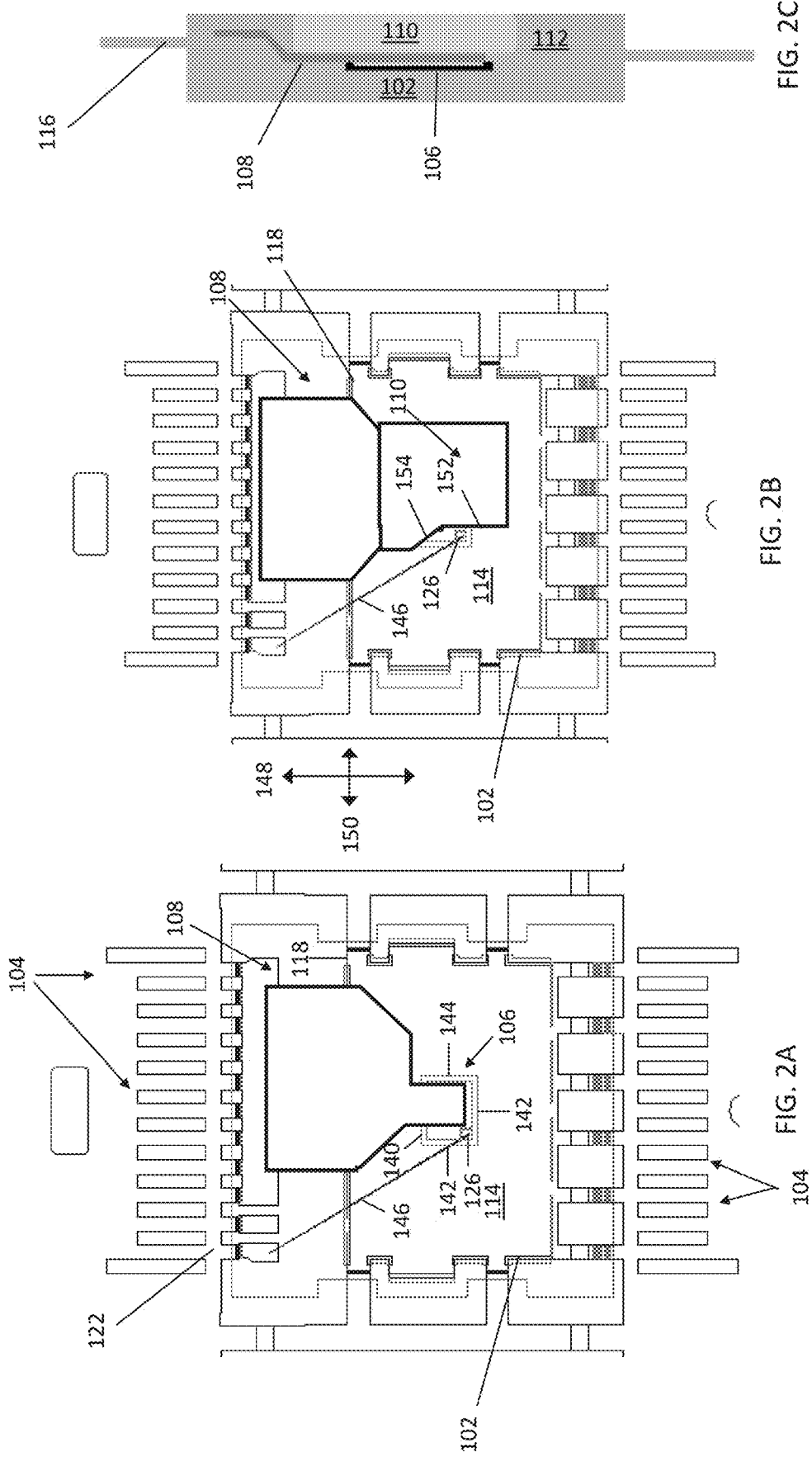
FIG. 2, which includes

Referring to FIGS. 1-2, a semiconductor package 100 includes a die pad 102, a plurality of electrically conductive leads 104, a semiconductor die 106, an electrically conductive interconnect clip 108, and a thermally conductive heat spreader 110. FIGS. 1A, 1B, 1C, 1D show a partial assembly of the package. FIG. 1E shows a completed semiconductor package 100 which includes an electrically insulating encapsulant body 112. The encapsulant body 112 includes an electrically insulating encapsulant material, e.g., ceramic, epoxy material, thermosetting plastic, etc. The encapsulant material is formed such that the semiconductor die 106 is encapsulated, and such that outer ends of the leads 104, a lower surface of the die pad 102 and an upper surface 138 of the heat spreader 110 are exposed from the encapsulant material. In this way, the semiconductor package 100 can be mated to a printed circuit board with the leads 104 providing I/O connectivity and the die pad 102 and heat spreader 110 providing dual side cooling of the mounted semiconductor package 100.

The die pad 102 and the leads 104 include an electrically conductive material, e.g., a metal such as copper, aluminium, nickel, etc., and alloys thereof. The die pad 102 and the leads 104 may be provided from a common lead frame structure which is structured from a planar sheet metal. The die pad 102 includes a die attach surface 114, which is a substantially planar and conductive surface configured for the mounting of a semiconductor die 106 thereon. The leads include a first lead 116 that is separated from the die pad 102 by a lateral gap between a first edge side 118 of the die pad 102 and an interior end of the first lead 116. The first lead 116 is physically detached and laterally separated from the die pad 102. A connection surface 120 of the first lead 116 extends to the interior end of the first lead 116. The connection surface 120 of the first lead 116 is configured to accommodate an interconnection structure, e.g., a bond wire, a clip, etc. The connection surface 120 is vertically spaced apart from the die attach surface 114. This vertical separation is in a vertical direction that is perpendicular to the die attach surface 114. In the depicted embodiment, the first lead 116 is includes a plurality of discrete lead portions that are fused together by a common pad. More generally, the first lead 116 can include any number of leads, including a single lead. The leads 104 additionally include a second lead 122 that is separated from the die pad 102 by a lateral gap between the first edge side 118 of the die pad 102 and an interior end of the second lead 122 in a similar manner.

The semiconductor die 106 is mounted on the die attach surface 114 of the die pad 102. Generally speaking, the semiconductor die 106 can have a wide variety of device configurations, such as MOSFET (Metal Oxide Semiconductor Field Effect Transistor), IGBT (Insulated Gate Bipolar Transistor), JFET (Junction Field Effect Transistor), diode, etc. Moreover, the semiconductor die 106 may include any of a wide variety of semiconductor materials including type IV semiconductors, e.g., silicon, silicon germanium, silicon carbide, etc., and type III-V semiconductors, e.g., gallium nitride, gallium arsenide, etc. Moreover, the semiconductor die 106 may be configured as a vertical device that is configured to control a current flowing between opposite facing upper and lower surfaces, or a lateral device that is configured to control a current flowing parallel to a main surface.

According to an embodiment, the semiconductor die 106 is configured as a discrete MOSFET device. More specifically, the semiconductor die 106 may be configured as a silicon carbide-based power MOSFET device that is rated to control voltages of at least 1200 V (volts).

The semiconductor die 106 is mounted with a lower surface that faces the die pad 102 and an upper surface that faces away from the die pad 102. The semiconductor die 106 includes first and second terminals 124, 126 on the upper surface of the semiconductor die 102. The first terminal 124 may be load terminal, such as a source terminal, drain terminal, collector terminal, etc., to which the main voltage is applied across. The second terminal 126 may be a control terminal, such as a gate terminal, base terminal, etc., that is configured to control a conductive state of the device. The semiconductor die 106 may additionally include a third terminal (not shown) on the rear surface. The third terminal may be another load terminal, such as a source terminal, drain terminal, collector terminal, etc., to which the main voltage is applied across. In one embodiment, the semiconductor die 106 is a power MOSFET, the first terminal 124 is a gate terminal, the second terminal 126 is a source terminal, and the third terminal is a drain terminal. Each of these terminals may be implemented by electrically conductive bond pads disposed on the surfaces of the semiconductor die 106. The third terminal may be electrically connected to the die pad 102 by a conductive adhesive, e.g., solder, sinter, conductive glue, etc.

The interconnect clip 108 includes an electrically conductive material, e.g., a metal such as copper, aluminium, nickel, etc., and alloys thereof. The interconnect clip 108 can be provided from a planar sheet metal and formed to include any of the geometric features described herein by metal processing techniques such as punching, stamping, bending, etc.

The interconnect clip 108 includes a first planar section 128, a second planar section 130, and a third planar section 132. The first, second and third planar sections 128, 130, 132 may be part of a continuous and substantially uniform thickness structure, with each of the first, second and third planar sections 128, 130, 132 having a substantially identical thickness between opposite facing upper and lower surfaces. The first planar section 128 is parallel to and vertically offset from the third planar section 132. This vertical offset corresponds to the offset distance between the die attach surface 114 and the connection surface 120 of the first lead 116. The second planar section 130 vertically extends from the first planar section 128 towards the first lead 116.

A first transitional bend 134 is disposed between the first and second planar sections 130, 132. A second transitional bend 136 is disposed between the second and third planar sections 130, 132. These transitional bends are locations of the interconnect clip 108 wherein the plane of the interconnect clip 108 changes direction. In the depicted embodiment, the first and second transitional bends 134, 136 form acute angled intersections between two planes. More generally, the first and second transitional bends 134, 136 may have curved or more gradual geometries. Moreover, the angle of inclination between the second planar section 130 and the first planar and/or third planar section 132 may vary from gently sloped, e.g., 30 degrees, to steep, e.g., 90 degrees.

The interconnect clip 108 electrically connects the first terminal 124 to the first lead 116. To effectuate this connection, the interconnect clip 108 is mounted in the assembly with the first planar section 128 being flush against the upper surface of the semiconductor die 106 and third planar section 132 being flush against the connection surface 120 of the first lead 116. Electrical contact may be achieved by direct contact or by providing a conductive intermediary, e.g., solder, sinter, adhesive, etc., between the interconnect clip 108 and the first terminal 124 and/or the first lead 116.

The heat spreader 110 is a discrete piece of thermally conductive material. For example, the heat spreader 110 can include a metal, such as copper, aluminium, etc., or alloys thereof. According to an embodiment, the heat spreader 110 is a continuous volume of thermally conductive material, meaning that no openings are cavities are contained within the heat spreader 110. The heat spreader 110 is mounted on an upper surface of the interconnect clip 108. This may be effectuated by a thermally conductive adhesive, e.g., solder, sinter, conductive glue, etc, provided between the heat spreader 110 and the heat spreader 110. During operation of the semiconductor die 106, the heat spreader 110 draws heat away from the semiconductor die 106 via the interconnect clip 108. According to an embodiment, the heat spreader 110 includes a substantially planar upper surface 138. In a complete semiconductor package 100, this upper surface 138 of the heat spreader 110 may be exposed from the encapsulant 112 so as to provide an interface for connection to a heat sink.

According to an embodiment, the first transitional bend 134 of the interconnect clip 108 is disposed in the lateral gap between the first edge side 118 of the die pad 102 and the interior end of the first lead 116. Hence, the first transitional bend 134 is laterally outside of the perimeter of the die pad 102. This configuration differs from conventional vertically offset clip designs wherein the angled transition occurs directly over the chip. In an embodiment that utilizes this concept, a lateral distance between the first transitional bend 134 and the first edge side 118 of the die pad 102 is at least 50% of an overall lateral distance of the lateral gap, and may be more than 60%, more than 70%, more than 80%, more than 90%, etc., in various embodiments.

As shown in FIG. 1C, the semiconductor die 106 includes a first outer edge 140 that faces the first lead 116, a second outer edge 142 opposite the first outer edge 140, and third and fourth outer edges 144, 146 each extending between the first and second outer edges 140, 142. These outer edges 140, 142, 144 and 146 form an outer perimeter of the semiconductor die 106. A portion of the upper surface of the semiconductor die 106 is covered by the interconnect clip 108. Another portion of the upper surface of the semiconductor die 106 is exposed from the interconnect clip 108. This exposed portion of the upper surface extends to the third outer edge 142 of the semiconductor die 106 and includes the second terminal 126. An electrically conductive bond wire 146 that electrically connects the second terminal 126 to the second lead 122 extends directly over the exposed portion of the upper surface.

As shown in FIG. 20, the heat spreader 110 includes a plurality of edge faces that form an outer perimeter of the heat spreader 110. The heat spreader 110 is arranged in a partially overlapping configuration with the semiconductor die 106 and with the interconnect clip 108. That is, the heat spreader 110 covers a portion of the interconnect clip 108.

The heat spreader 110 laterally extends past the first outer edge 140 side of the semiconductor die 106. That is, the heat spreader 110 expands past the semiconductor die 106 in a first lateral direction 148 that is parallel to the current flow direction between the first terminal 124 and the first lead 116.

According to an embodiment, the heat spreader 110 has a greater area than the semiconductor die 106. Specifically, the heat spreader 110 may have an area that is twice as large as the semiconductor die 106. This means that the outer periphery of the heat spreader 110 as formed by the edge faces of the heat spreader 110 occupies a larger two-dimensional space than an outer periphery of the semiconductor die 106 as formed by the outer edges of the semiconductor die 106. If the heat spreader 110 has a multi-thickness configuration (e.g., as disclosed in below embodiments), the outer periphery of the heat spreader 110 refers to the outer periphery of the thickness region with the largest area.

The large area of the heat spreader 110 is attributable to the geometric features of the interconnect clip 108, the heat spreader 110, or both. Specifically, by locating the first transitional bend 134 of the interconnect clip 108 in the lateral gap between the first edge side 118 of the die pad 102 and the first lead 116, the heat spreader 110 can be extended in the first lateral direction 148. Meanwhile, the geometry of the heat spreader 110 is tailored to allow the heat spreader 110 to extend past the third and/or fourth outer edges 142, 144 of the semiconductor die 106 in a second lateral direction 150 that is perpendicular to the first lateral direction 148, while simultaneously accommodating a bond wire. Various examples of these geometries are illustrated in the embodiments discussed below.

According to an embodiment, the outer perimeter of the heat spreader 110 has a polygon shape. As used herein, a polygon shape describes an enclosed geometry made up of at least five linear spans with an angled intersection between each span. In other words, a polygon is more complex than a rectangle. Examples of polygon geometries include U-shaped geometries, C-shaped geometries, otherwise rectangular geometries with notches in one side, and geometries that include obtuse angles. This configuration allows the heat spreader 110 to expand in different directions while simultaneously accommodating the bond wire. The polygon-shaped heat spreader 110 of FIG. 1 includes a side with three linear spans, with one of the linear spans being angled relative to the other two. This allows the heat spreader 110 to laterally extend past the third outer edge 142 of the semiconductor die 106.

According to an embodiment, the heat spreader 110 laterally extends past at least two of the first, second, third and fourth outer edges 140, 142, 144, 146. In this way, the effective cooling surface of the heat spreader 110 can be beneficially increased. Various configurations of the heat spreader 110 and/or interconnect clip 108 will be described in further below for achieving this expanded surface area.

Figure 3:
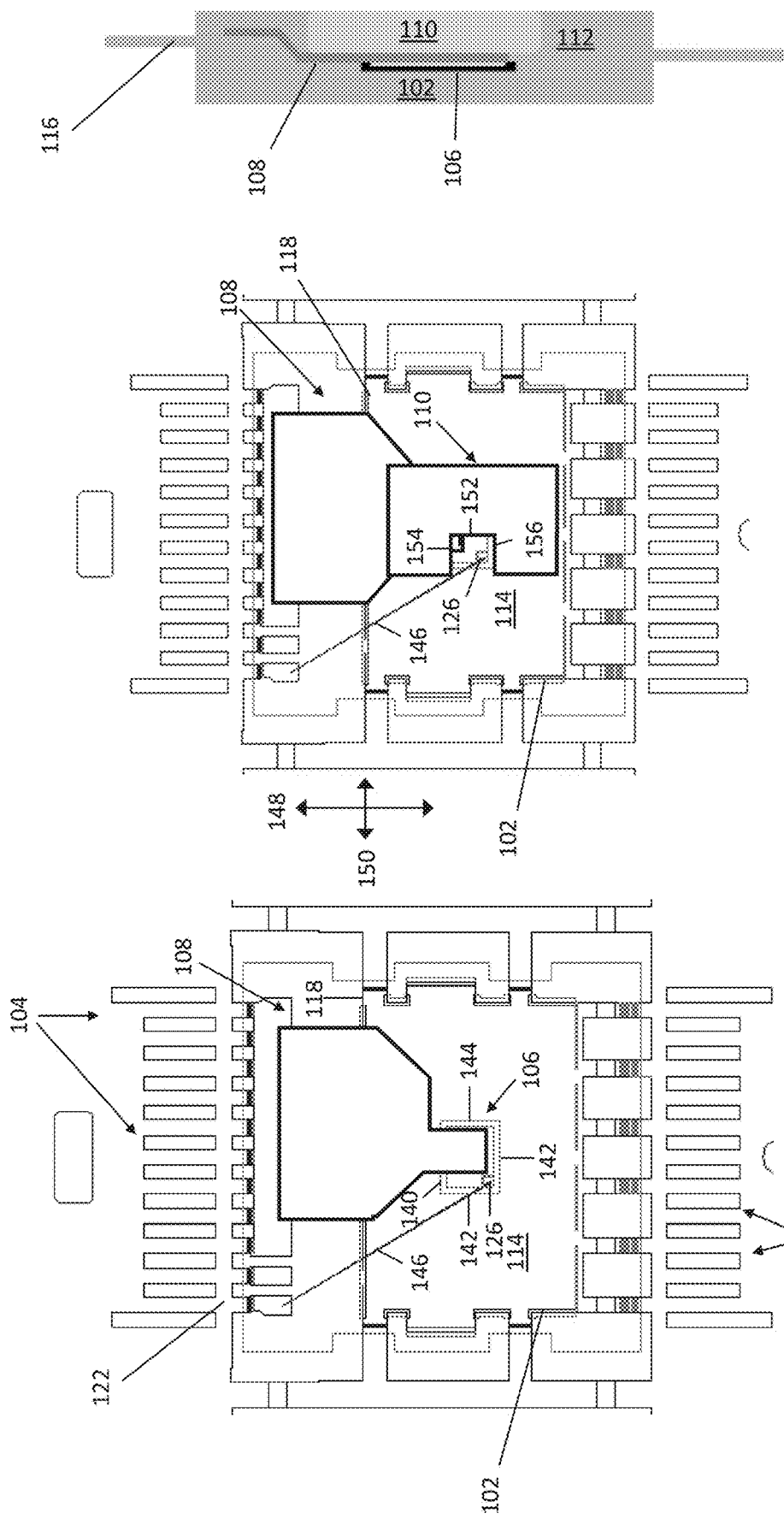
FIG. 3, which includes

Referring to FIG. 2, an embodiment of the semiconductor package 100 with a polygon-shaped heat spreader 110 is depicted, according to an embodiment. In the embodiment of FIG. 3, the heat spreader 110 includes first and second edge faces 152, 154 that form an angled intersection with one another. For example, the first and second edge faces 152, 150 may intersect one another at an angle of between about 120 and 150 degrees. The second terminal 126 is laterally disposed between the first edge face 152 and the third outer edge 142 of the semiconductor die 106. The second edge face 154 laterally extends past the third outer edge 142 of the semiconductor die 106. In the depicted embodiment, the second edge face 154 extends directly over the third outer edge 142 of the semiconductor die 106. Alternatively, the second edge face 152 may cross the plane third outer edge 142 outside of the die footprint. In the depicted embodiment, the heat spreader 110 also extends past the second outer edge 142 of the semiconductor die 106. Hence, a large surface area of the heat spreader 110 is provided.

Referring to FIG. 3, an embodiment of the semiconductor package 100 with a polygon-shaped heat spreader 110 is depicted, according to an embodiment. In this embodiment, the heat spreader 110 includes first, second and third edge faces 152, 154, 156. The second terminal 126 is laterally disposed between the first edge face 152 and the third outer edge 142 of the semiconductor die 106. The second and third edge faces 154, 156 each form substantially perpendicular angles with the first edge face. As a result, the heat spreader 110 includes a u-shaped notch formed by three edge faces which accommodates the connection of the bond wire 146. This u-shaped notch provides an exposed area for the bond wire 146 to enter and contact the first terminal 124. In this embodiment, the heat spreader 110 laterally extends past all four outer edges 140, 142, 144 and 146 of the semiconductor die 106. Hence, a large surface area of the heat spreader 110 is provided.

Figure 4:
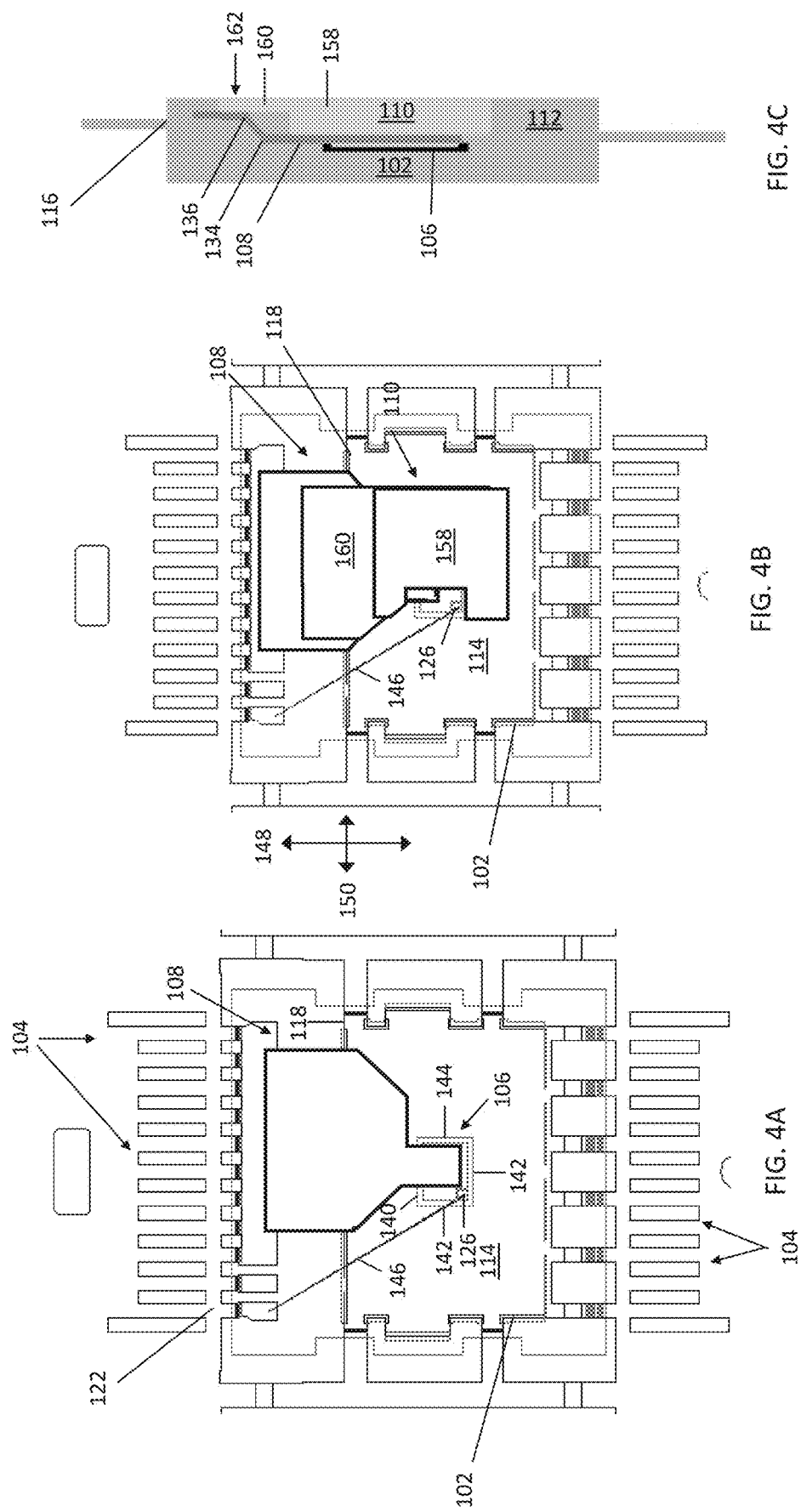
FIG. 4, which includes

Referring to FIG. 4, an embodiment of the semiconductor package 100 with a polygon-shaped and multi-thickness configured heat spreader 110 is depicted, according to an embodiment. The heat spreader 110 includes a thicker portion 158 and a thinner portion 160. The thickness of each portion is a shortest distance between upper and lower surface of the interconnect clip 108. The multi-thickness configuration allows the heat spreader 110 to laterally expand past the semiconductor die 106 in both the first lateral direction 148 and the second lateral direction 150. The lower surface of the thicker portion 158 is flush against the upper surface of the interconnect clip 108. Thus, the thicker portion 158 forms a thermal interface with the interconnect clip 108. Meanwhile, a lower surface of the thinner portion 160 laterally extends outward from the thinner portion 160 and is spaced apart from the interconnect clip 108 in the region immediately adjacent the thicker portion 158. This lateral expansion of the interconnect clip 108 provides a larger surface area for the mounting of a heat sink on top of the heat spreader 110.

In the embodiment of FIG. 4, the thinner portion 160 of the heat spreader 110 includes a first wing 162 that laterally extends past the thicker section 158 in the first lateral direction 148. The first wing 162 may laterally extend past the first transitional bend 134. As shown, the first wing 162 extends past both of the first and second transitional bends 134, 136 and directly contacts an upper surface of the interconnect clip 108 in the third planar section 132. Hence, the multi-thickness configuration enables a large area for cooling and thermal coupling to a heat sink structure.

Figure 5:
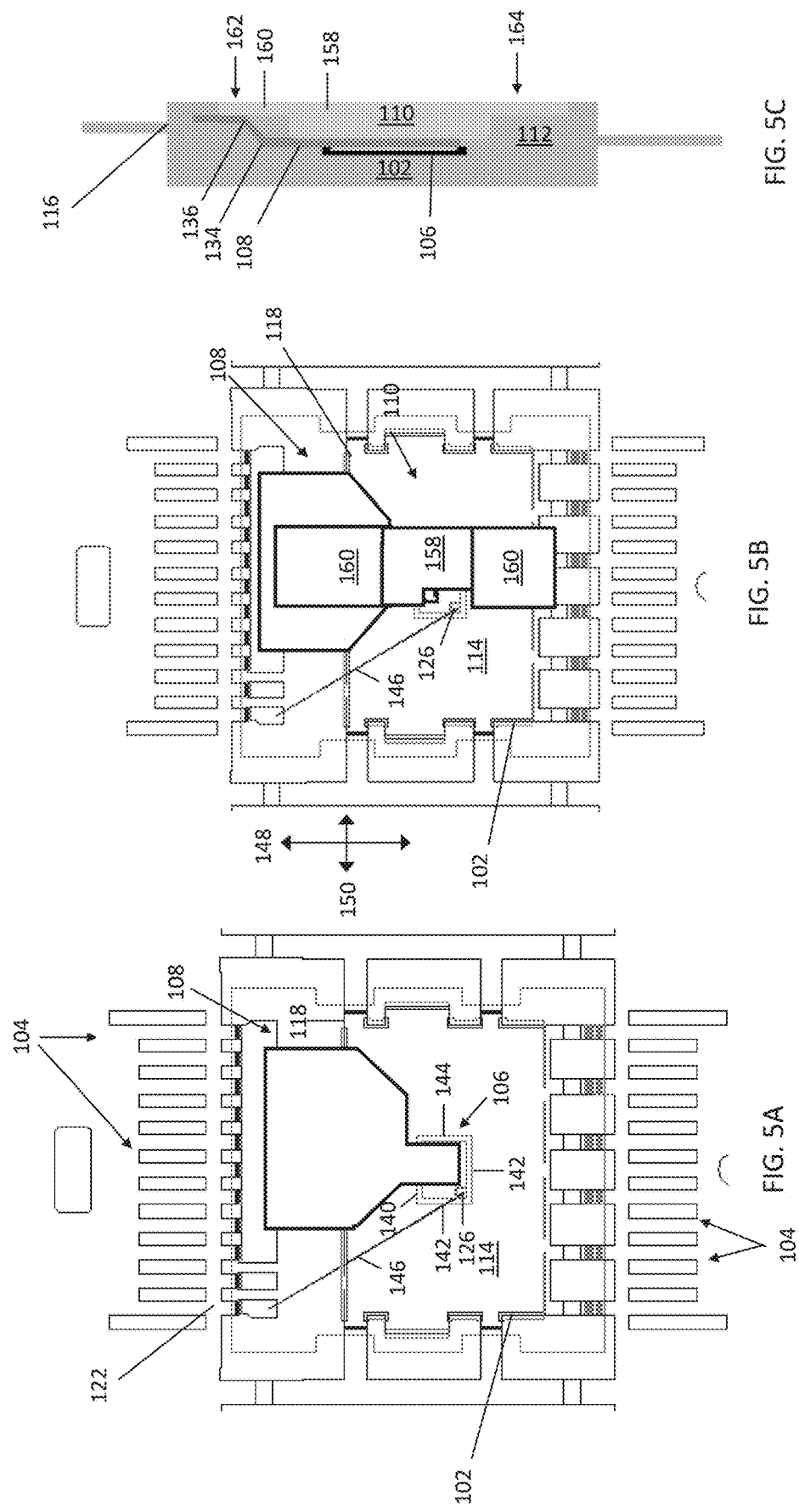
FIG. 5, which includes

Referring to FIG. 5, an embodiment of the semiconductor package 100 with a polygon-shaped and multi-thickness configured heat spreader 110 is depicted, according to an embodiment. In this embodiment, the thinner portion 160 includes a second wing 164 that laterally extends past the second outer edge 142 of the semiconductor die 106. Hence, the effective surface contact area for cooling is expanded further in the first lateral direction 148. The second wing 164 may have similar or identical thickness and length as the first wing 162. Optionally, the second wing 162 may extend past a second edge side of the die pad 102 that is opposite from the first edge side 118.

Figure 6:
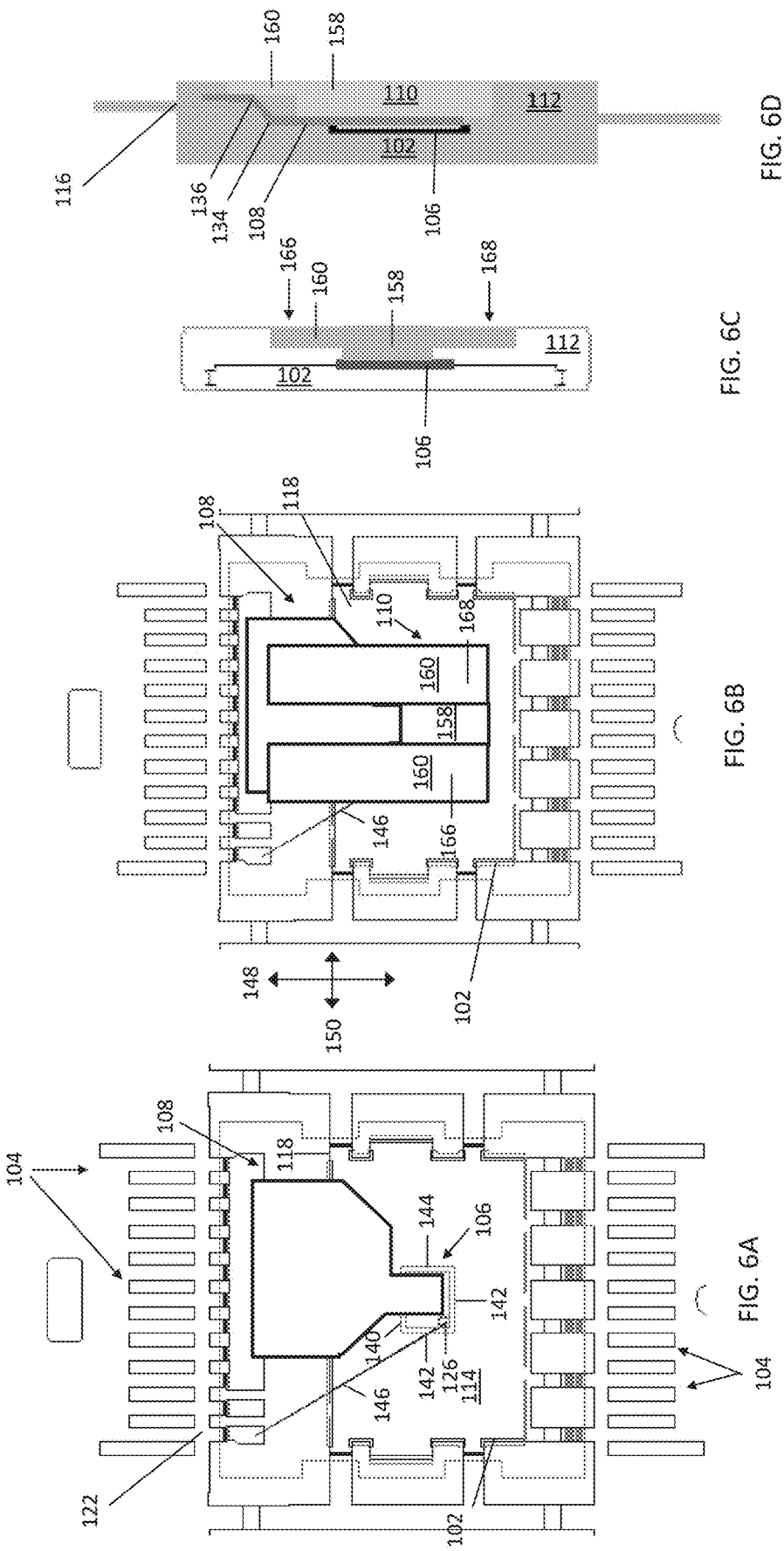
FIG. 6, which includes

Referring to FIG. 6, an embodiment of the semiconductor package 100 with a polygon-shaped and multi-thickness configured heat spreader 110 is depicted, according to an embodiment. In this embodiment, the multi-thickness concept is used to expand the upper area of the heat spreader 110 in multiple different lateral directions. Specifically, the thinner portion 160 of the heat spreader 110 includes third and fourth wings 166, 168 which laterally extend past the semiconductor die 106 in the second lateral direction 150. As shown in FIG. 6C, the third wing 166 laterally extends past the third outer edge 142 of the semiconductor die 106 and the fourth wing 164 laterally extends past the fourth outer edge 144 of the semiconductor die 106. Moreover, due to the vertical separation between the third wing 166 and the die attach surface 114, the bond wire 146 can enter an area that is below the third wing 166 and access the second terminal 126 of the semiconductor die 106. Hence, in comparison to the previous embodiments, features such as oblique angles or notches in the edge faces of the heat spreader 110 are not needed to accommodate the bond wire. As shown in FIG. 6D, the third and fourth wings 166, 168 may also extend past the first outer edge 140 and past the first and second transitional bends 134, 136 in the first lateral direction 148, thus providing the benefit of the first wing 162 as previously described.

Figure 7:
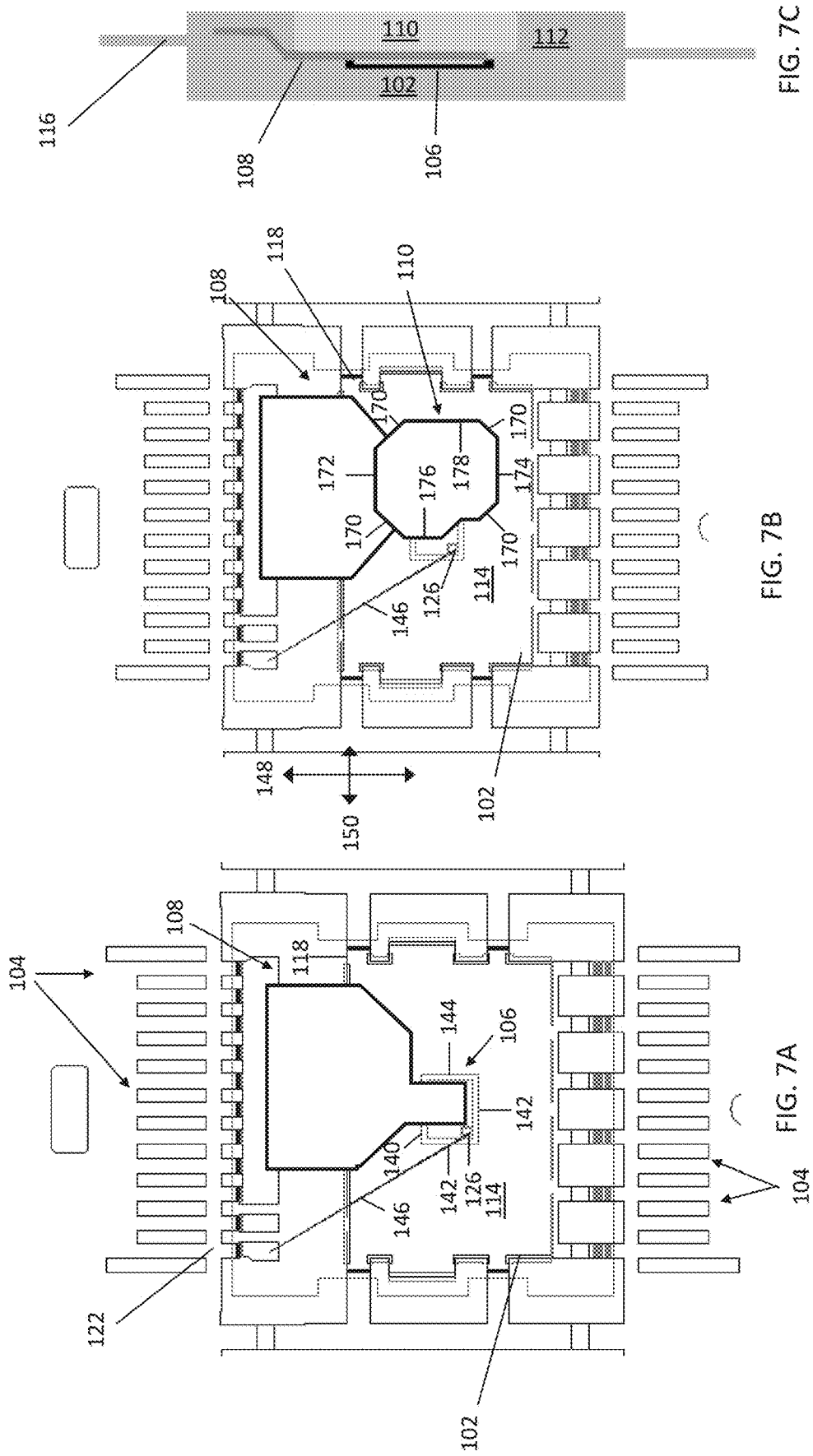
FIG. 7, which includes

Referring to FIG. 7, an embodiment of the semiconductor package 100 with a polygon-shaped heat spreader 110 is depicted, according to an embodiment. In this embodiment, the heat spreader 110 includes at least one chamfer 170 between at two edge faces. A chamfer refers to a structural feature that intersects with two edge surfaces thereby reducing the transitional angle between the two edge surfaces. In this example, the heat spreader 110 includes first, second, third and fourth edge faces 172, 174, 176 and 178, wherein the first and second edge faces 172, 174 are substantially perpendicular to one another, the second and third edge faces 174, 176 are substantially perpendicular to one another, and so forth. The chamfers 170 are formed by planar edge faces oriented at about 45 degrees relative to two perpendicular edge faces. More generally, the angle of the chamfer 170 may vary and/or the chamfer 170 may include a rounded transition. One benefit of the chamfer 170 is a reduction in thermal stress, due to differences in coefficient of thermal expansion of the encapsulant material, which cause expansion or contraction at high temperatures, e.g., from the manufacturing process or during operation.

Figure 8:
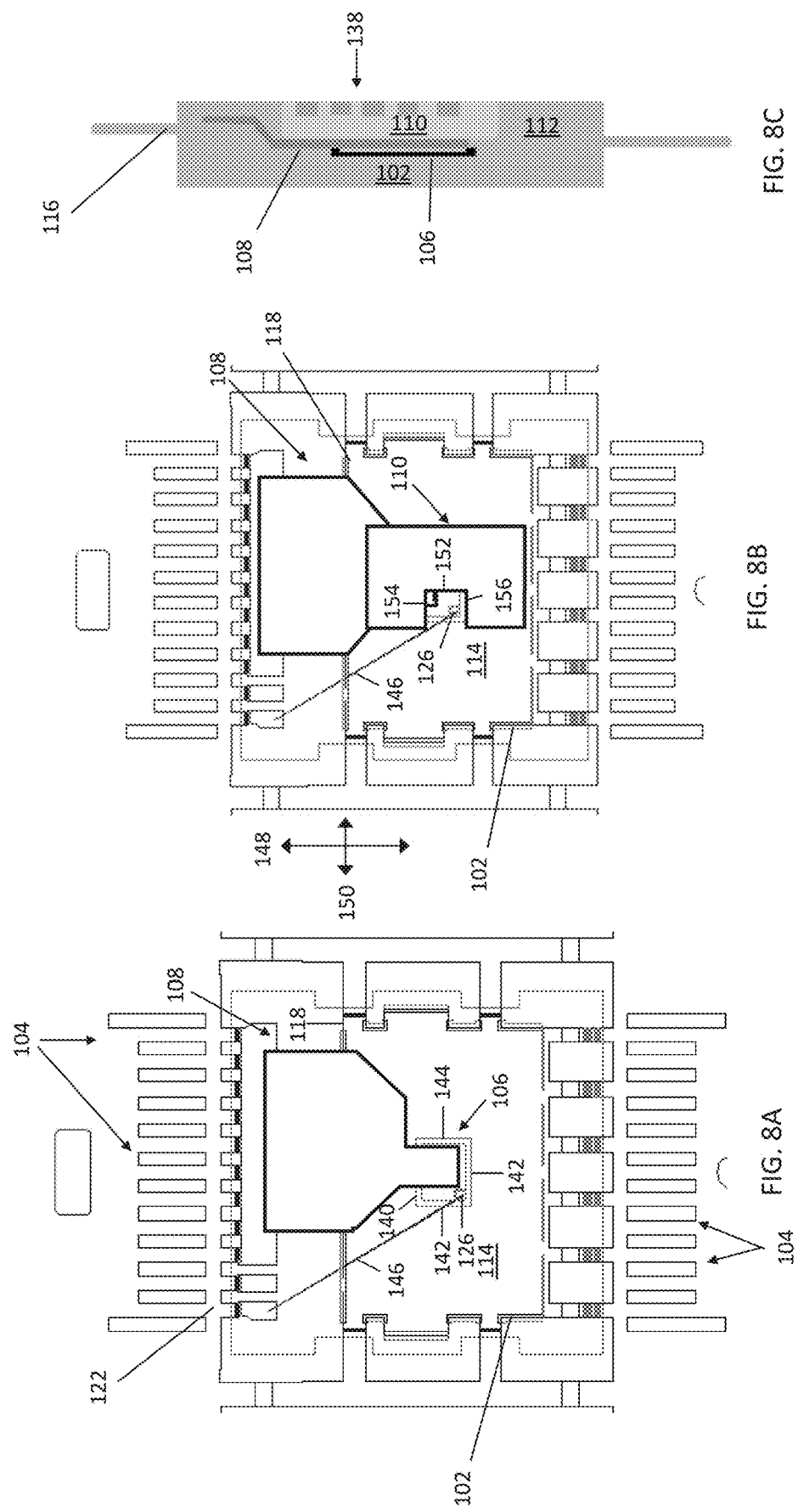
FIG. 8, which includes

Referring to FIG. 8, an embodiment of the semiconductor package 100 with a polygon-shaped heat spreader 110 is depicted, according to an embodiment. In this embodiment, the heat spreader 110 has the same two-dimensional geometry as the heat spreader 110 described with reference to FIG. 3. Additionally, an upper surface 138 of the heat spreader 110 that is opposite from the upper surface of the interconnect clip 108 is corrugated. This means that the upper surface of the heat spreader 110 includes alternating peaks and valleys. As shown, the peaks and valleys are regularly spaced apart and are substantially rectangular shaped. More generally, the corrugation pattern may include non-regular and/or non-rectangular features. One benefit of the corrugation is enhanced adhesion to the encapsulant material (e.g., mold compound). Another benefit of the corrugation is increased surface area in comparison to a flat upper surface configuration. This increased surface area leads provides enhanced heat dissipation if, for instance, an external heat sink is not used in combination with the device. Put another way, the corrugation incorporates a kind of heat sink structure into the package itself.

Figure 9:
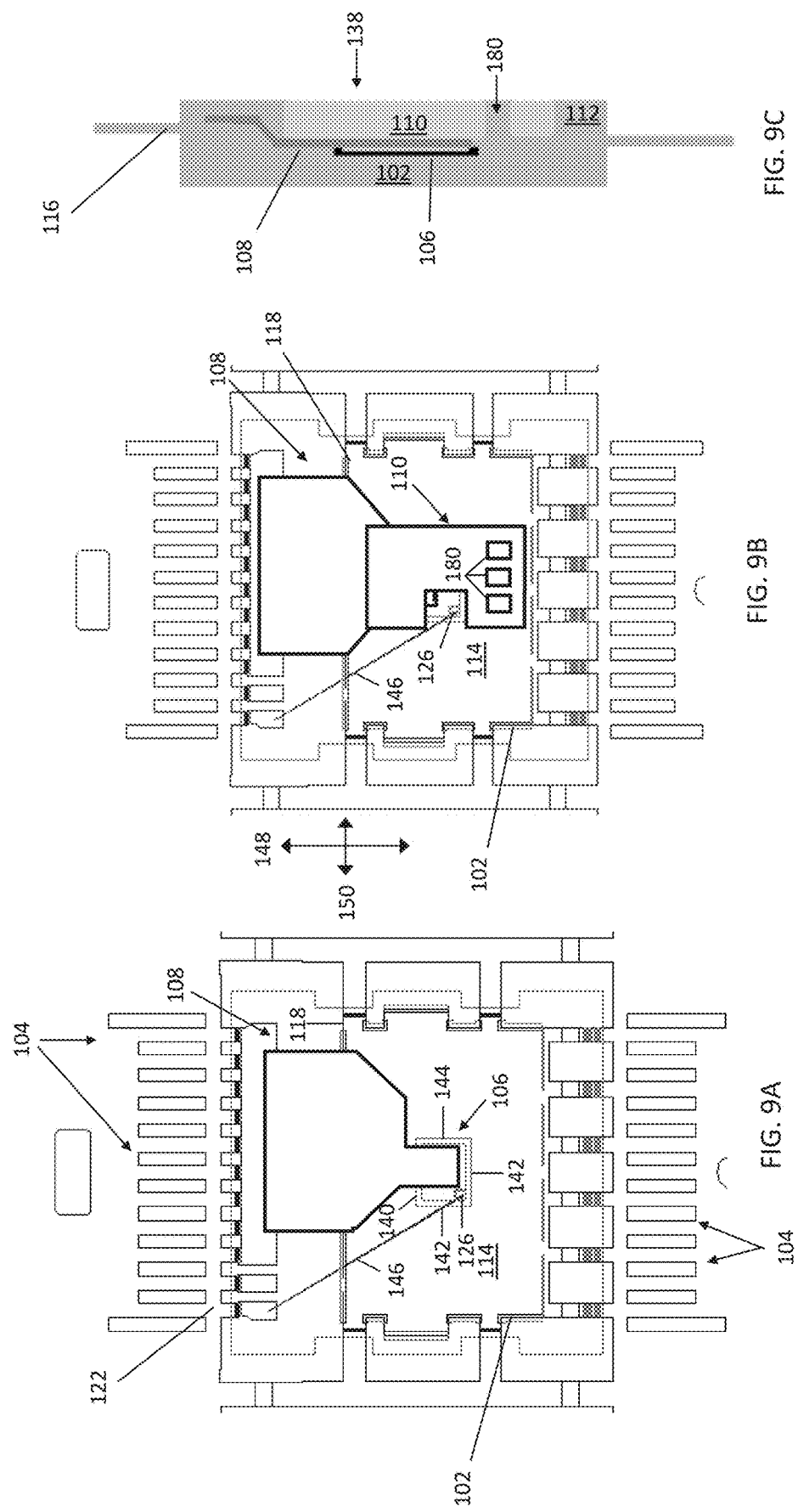
FIG. 9, which includes

Referring to FIG. 9, an embodiment of the semiconductor package 100 with a polygon-shaped heat spreader 110 is depicted, according to an embodiment. In this embodiment, the heat spreader 110 has the same two-dimensional outer geometry as the heat spreader 110 described with reference to FIG. 3. Additionally, the heat spreader 110 includes a number of perforations 180 that extend through opposite facing upper and lower surfaces of the heat spreader 110. As shown, the perforations 180 are disposed in a region of the heat spreader 110 that extend past the second outer edge 142 of the die. More generally, the perforations 180 can be disposed in any region that is outside of the perimeter of the semiconductor die 106. Moreover, the size, number and shape of the perforations 180 may vary. One benefit of the perforations 180 is enhanced adhesion to the encapsulant material 112 due to increased surface area contact with the encapsulant material. This enhanced adhesion provides mechanical stability for the heat spreader 110 such that it does not easily deviate from the intended mounting position.

Figure 10:
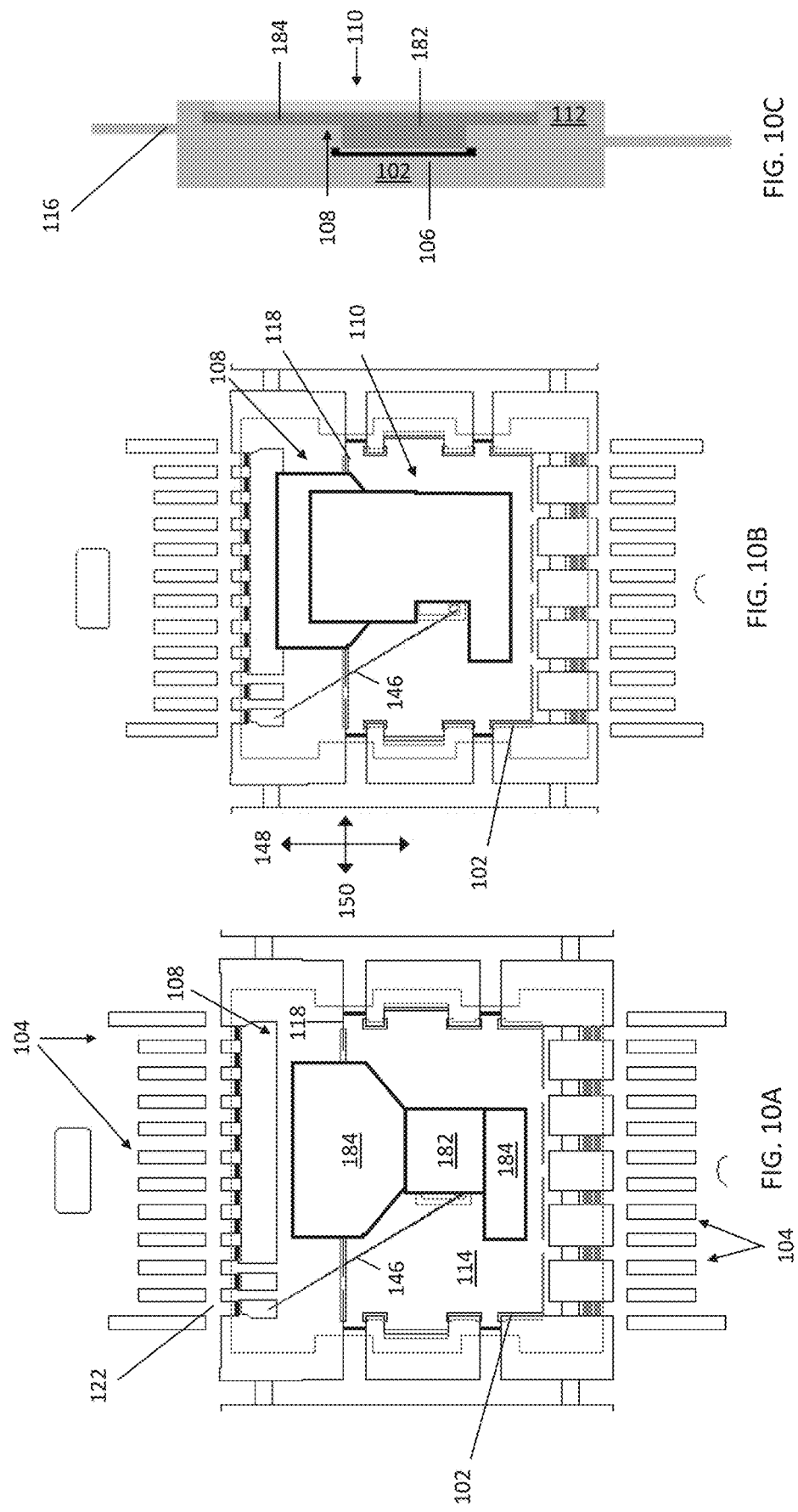
FIG. 10, which includes

Referring to FIG. 10, an embodiment of the semiconductor package 100 with a polygon-shaped heat spreader 110 is depicted, according to an embodiment. In the embodiment of FIG. 10, both the interconnect clip 108 and the heat spreader 110 have a different configuration than the previously described embodiments. Specifically, the interconnect clip 108 has a multi-thickness configuration, which includes a thicker portion 182 and a thinner portion 184. Moreover, the heat spreader 110 is a substantially flat structure that is disposed over the thicker and thinner portion 160s.

The thicker portion 184 of the interconnect clip 108 may have about the same areal footprint as the semiconductor die 106 (e.g., within +/−10%) and includes a lower surface that flush against the upper surface of the semiconductor die 106. The thinner portion 184 of the interconnect clip 108 laterally extends outward from the thicker portion 184 of the interconnect clip 108, and thus has a larger area than the semiconductor die 106. In the depicted example, the thinner portion 184 of the interconnect clip 108 laterally extends over the first, second and fourth outer edges 140, 142 and 144 of the semiconductor die 106. Moreover, a lower wing of the thinner portion 184 extends past the third outer edge 142 of the semiconductor die 106 outside of the die footprint. By elevating the plane of lateral expansion to a plane that is substantially coplanar with the first lead 116, the multi-thickness interconnect clip 108 configuration represents an alternative way to expand the area of the heat spreader 110 in both the first and second lateral directions 148, 150. The thicker portion 182 of the interconnect clip 108 provides a mechanism for pulling heat away from the semiconductor die 106, while the substantially flat heat spreader 110 may have a large surface area to transfer this heat to an external heat sink apparatus.

The concepts described herein are applicable to a wide variety of package configurations. Generally speaking, these package configurations include any package design wherein heat dissipation is desirable at the upper surface of the semiconductor die and/or wherein the semiconductor die includes at least one upward facing bond pad that requires electrical connection. Examples of these package configurations include leaded packages, leadless packages, chip carrier packages, surface mount packages, stacked die packages, molded packages, cavity packages, etc.

The term "substantially" as used herein encompasses absolute conformity with the specified requirement as well as minor deviations from absolute conformity with the requirement due to manufacturing process variations, assembly, and other factors that may cause a deviation from the design goal. Provided that the deviation is within process tolerances so as to achieve practical conformity and the components described herein are able to function according to the application requirements, the term "substantially" encompasses any of these deviations.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor package, comprising:
a die pad comprising a die attach surface;
a first lead that is laterally separated from and vertically offset from the die pad;
a semiconductor die that is mounted on the die attach surface and comprises a first terminal on an upper surface of the semiconductor die that faces away from the die pad;
an interconnect clip that is electrically connected to the first terminal and to the first lead; and
a heat spreader mounted on top of the interconnect clip, wherein the interconnect clip comprises a first planar section that interfaces with the upper surface of the semiconductor die and extends past an outer edge side of the die pad, wherein the heat spreader covers an area of the first planar section that is larger than an area of the semiconductor die, and wherein the heat spreader laterally extends past a first outer edge side of the die pad that faces the first lead.

2. The semiconductor package of claim 1, wherein the interconnect clip comprises a second planar section that forms a first transitional bend with the first planar section and vertically extends towards the first lead, and wherein the first transitional bend is disposed in a lateral gap between the first edge side of the die pad and an interior end of the first lead.

3. The semiconductor package of claim 2, wherein the interconnect clip comprises a third planar section that forms a second transitional bend with the second planar section and is flush against a connection surface of the first lead, and wherein the first and third planar sections are substantially parallel to one another.

4. The semiconductor package of claim 2, wherein the semiconductor die comprises a first outer edge that faces the first lead, a second outer edge opposite the first outer edge, and third and fourth outer edges each extending between the first and second outer edges, and wherein the heat spreader laterally extends past at least two of the first, second, third and fourth outer edges.

5. The semiconductor package of claim 4, wherein the semiconductor die further comprises a second terminal on the upper surface of the semiconductor die, wherein the semiconductor package further comprises a second lead that is separated from the die pad by a lateral gap between the first edge side of the die pad and an interior end of the second lead, and an electrically conductive bond wire that electrically connects the second terminal to the second lead, wherein the bond wire extends directly over an exposed region of the upper surface of the semiconductor die, the exposed region being a region of the upper surface of the semiconductor die that includes the second terminal, extends to the third outer edge of the semiconductor die, and is exposed from the interconnect clip.

6. The semiconductor package of claim 5, wherein the heat spreader comprises first and second edge faces that form an angled intersection with one another, wherein the second terminal is laterally disposed between the first edge face and the third outer edge of the semiconductor die, and wherein the second edge face laterally extends past the third outer edge of the semiconductor die.

7. The semiconductor package of claim 5, wherein the heat spreader comprises a thicker portion and a thinner portion, wherein a lower surface of the thicker portion is flush against the upper surface of the interconnect clip, and wherein a lower surface of the thinner portion laterally extends outward from the thinner portion and is spaced apart from the interconnect clip.

8. The semiconductor package of claim 7, wherein the thinner portion comprises a first wing that laterally extends past the first transitional bend.

9. The semiconductor package of claim 8, wherein the thinner portion comprises a second wing that laterally extends past the second outer edge of the semiconductor die.

10. The semiconductor package of claim 7, wherein the thinner portion comprises a third wing that laterally extends past the third outer edge of the semiconductor die, and wherein the third wing extends over the bond wire.

11. The semiconductor package of claim 10, wherein the thinner portion comprises a fourth wing that laterally extends past the fourth outer edge of the semiconductor die.

12. The semiconductor package of claim 2, wherein the heat spreader comprises at least one chamfer between two edge faces that are substantially perpendicular to one another.

13. The semiconductor package of claim 2, wherein an upper surface of the heat spreader that is opposite from the upper surface of the interconnect clip is corrugated.

14. The semiconductor package of claim 2, wherein the heat spreader comprises at least one perforation that extends through opposite facing upper and lower surfaces of the heat spreader.

15. The semiconductor package of claim 1, wherein the interconnect clip comprises a thicker portion and a thinner portion, wherein a lower surface of the thicker portion of the interconnect clip is flush against the upper surface of the semiconductor die, and wherein the thinner portion of the interconnect clip laterally extends outward from the thicker portion of the interconnect clip.

16. The semiconductor package of claim 15, wherein the heat spreader is a substantially flat structure this is disposed directly on the thicker portion and the thinner portion.

17. The semiconductor package of claim 1, wherein an outer perimeter of the heat spreader has a polygon shape.

18. The semiconductor package of claim 17, wherein the outer perimeter of the heat spreader comprises:

an obtuse angle at an intersection between two edge faces; or a u-shaped notch formed by three edge faces.

19. The semiconductor package of claim 8, wherein the interconnect clip comprises a third planar section that forms a second transitional bend with the second planar section and is flush against a connection surface of the first lead, and wherein the first wing of the heat spreader directly contacts an upper surface of the interconnect clip in the third planar section.

20. The semiconductor package of claim 1, wherein the heat spreader comprises a lower surface that faces the interconnect clip and an upper surface opposite from the lower surface, and wherein the lower surface and the upper surface of the heat spreader each extend parallel to one another along a single plane from a first end of the heat spreader to a second end of the heat spreader, the first and second ends of the heat spreader each being disposed outside of the semiconductor die.

* * * * *